United States Patent
Briere

(10) Patent No.: US 8,084,785 B2
(45) Date of Patent: Dec. 27, 2011

(54) III-NITRIDE POWER SEMICONDUCTOR DEVICE HAVING A PROGRAMMABLE GATE

(75) Inventor: Michael A. Briere, Manhattan Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 171 days.

(21) Appl. No.: 11/857,113

(22) Filed: Sep. 18, 2007

(65) Prior Publication Data

US 2008/0087917 A1  Apr. 17, 2008

Related U.S. Application Data

(63) Continuation-in-part of application No. 11/460,725, filed on Jul. 28, 2006.

(60) Provisional application No. 60/703,931, filed on Jul. 29, 2005.

(51) Int. Cl.
*H01L 29/739* (2006.01)

(52) U.S. Cl. ......... 257/194; 257/E29.246; 257/E21.422; 438/257

(58) Field of Classification Search ............. 257/192
See application file for complete search history.

(56) References Cited

U.S. PATENT DOCUMENTS

| | | | | |
|---|---|---|---|---|
| 4,612,560 A * | 9/1986 | Dortu et al. | ............ | 257/280 |
| 5,055,890 A * | 10/1991 | Dawson et al. | ............ | 257/192 |
| 5,381,028 A * | 1/1995 | Iwasa | ............ | 257/316 |
| 5,471,077 A * | 11/1995 | Sokolich | ............ | 257/192 |
| 5,693,964 A * | 12/1997 | Ohta et al. | ............ | 257/194 |
| 5,914,509 A * | 6/1999 | Schmidt et al. | ............ | 257/296 |
| 6,023,079 A * | 2/2000 | Hida | ............ | 257/192 |
| 6,489,628 B1 * | 12/2002 | Morizuka | ............ | 257/12 |
| 6,768,146 B2 * | 7/2004 | Yoshida | ............ | 257/279 |
| 7,038,253 B2 * | 5/2006 | Yoshida et al. | ............ | 257/192 |
| 7,052,942 B1 * | 5/2006 | Smart et al. | ............ | 438/162 |
| 7,087,957 B2 * | 8/2006 | Matsuda | ............ | 257/330 |
| 7,141,832 B2 * | 11/2006 | Sugiyama et al. | ............ | 257/133 |
| 7,375,407 B2 * | 5/2008 | Yanagihara et al. | ............ | 257/471 |
| 7,382,001 B2 * | 6/2008 | Beach | ............ | 257/194 |
| 7,622,763 B2 * | 11/2009 | Suda et al. | ............ | 257/315 |
| 7,639,061 B2 * | 12/2009 | Sugiyama et al. | ............ | 327/374 |
| 7,659,539 B2 * | 2/2010 | Kreps et al. | ............ | 257/28 |
| 7,932,539 B2 * | 4/2011 | Chen et al. | ............ | 257/194 |
| 2002/0119610 A1 * | 8/2002 | Nishii et al. | ............ | 438/167 |
| 2003/0094649 A1 | 5/2003 | Hueting et al. | | |
| 2004/0259384 A1 | 12/2004 | Nag et al. | | |
| 2005/0051796 A1 * | 3/2005 | Parikh et al. | ............ | 257/192 |
| 2005/0110042 A1 * | 5/2005 | Saito et al. | ............ | 257/192 |

(Continued)

FOREIGN PATENT DOCUMENTS

JP  63-36573  2/1988

(Continued)

OTHER PUBLICATIONS

International Search Report issued in PCT Application Serial No. PCT/US06/29707 dated Oct. 31, 2007.

*Primary Examiner* — Thomas L Dickey
*Assistant Examiner* — William Harriston
(74) *Attorney, Agent, or Firm* — Farjami & Farjami LLP

(57) ABSTRACT

A III-nitride semiconductor device which includes a charged floating gate electrode.

20 Claims, 2 Drawing Sheets

U.S. PATENT DOCUMENTS

| | | |
|---|---|---|
| 2005/0145883 A1 | 7/2005 | Beach et al. |
| 2005/0189561 A1* | 9/2005 | Kinzer et al. .................. 257/192 |
| 2006/0060871 A1* | 3/2006 | Beach ............................ 257/94 |
| 2006/0243963 A1* | 11/2006 | Kreps et al. ..................... 257/28 |
| 2006/0243964 A1* | 11/2006 | Kreps et al. ..................... 257/28 |
| 2006/0261327 A1* | 11/2006 | Kreps et al. ..................... 257/28 |
| 2007/0114569 A1* | 5/2007 | Wu et al. ....................... 257/194 |
| 2007/0224710 A1* | 9/2007 | Palacios et al. ................. 438/12 |
| 2007/0249119 A1* | 10/2007 | Saito ............................. 438/253 |
| 2007/0278518 A1* | 12/2007 | Chen et al. .................... 257/192 |
| 2007/0295993 A1* | 12/2007 | Chen et al. .................... 257/194 |
| 2008/0043796 A1* | 2/2008 | Jikutani et al. ............. 372/50.11 |
| 2008/0069971 A1* | 3/2008 | Keersmaecker et al. ...... 427/555 |
| 2008/0135880 A1* | 6/2008 | Yoshida et al. ................ 257/194 |
| 2008/0169492 A1* | 7/2008 | Koo et al. ...................... 257/295 |
| 2010/0038681 A1* | 2/2010 | Sugimoto et al. ............. 257/194 |
| 2010/0044751 A1* | 2/2010 | Bahramian ................... 257/192 |

FOREIGN PATENT DOCUMENTS

| | | |
|---|---|---|
| JP | 7-106574 | 4/1995 |
| JP | 10-135359 | 5/1998 |
| JP | 2002-64203 | 2/2002 |
| JP | 2002-324813 | 11/2002 |
| JP | 2004-311961 | 11/2004 |

* cited by examiner ized III-NITRIDE POWER SEMICONDUCTOR DEVICE HAVING A PROGRAMMABLE GATE

RELATED APPLICATIONS

The present application is a continuation-in-part of U.S. patent application Ser. No. 11/460,725, filed on Jul. 28, 2006, entitled NORMALLY OFF III-NITRIDE SEMICONDUCTOR DEVICE HAVING A PROGRAMMABLE GATE, which is based on and claims priority to U.S. Provisional Patent Application No. 60/703,931, filed on Jul. 29, 2005, entitled NORMALLY OFF III-NITRIDE SEMICONDUCTOR DEVICE HAVING A PROGRAMMABLE GATE, the entire disclosures of which are incorporated herein by reference.

FIELD OF THE INVENTION

The present application relates to power semiconductor devices, and more particularly to III-nitride power semiconductor devices.

DEFINITION

As referred to herein a III-nitride semiconductor or III-nitride refers to a semiconductor alloy from the InAlGaN system, including, but not limited to, GaN, AlGaN, AlN, InGaN, InAlGaN, and the like.

BACKGROUND OF THE INVENTION

A conventional III-nitride heterojunction power semiconductor device includes one III-nitride semiconductor body of one band gap disposed over another III-nitride semiconductor body of another band gap to form a two dimensional electron gas that serves as a conduction channel between the power electrodes of the device. III-nitride heterojunction power semiconductor devices are commercially desirable because of their high band gap and high current carrying capabilities. However, a typical III-nitride power semiconductor device is normally ON. Generally speaking, a normally ON power semiconductor device is less desirable in that it requires additional circuitry to keep its channel open in order to render the same OFF.

It is, therefore, desirable to have a normally off III-nitride power semiconductor device.

Moreover, even in normally ON devices, it may be desirable to set/program the threshold voltage of the device.

SUMMARY OF THE INVENTION

A semiconductor device according to the present invention includes a first III-nitride semiconductor body having a band gap, a second III-nitride semiconductor body having another band gap over the first III-nitride semiconductor body to form a III-nitride heterojunction having a two dimensional electron gas, a first power electrode coupled to the second III-nitride semiconductor body, a second power electrode coupled to the second III-nitride semiconductor body, a gate arrangement that include a non-volatile, charged floating gate and a gate electrode arranged over the charged floating gate.

According to one aspect of the present invention the charge in the charged floating gate may be selected to interrupt the two dimensional electron gas.

According to another aspect of the present invention the charge in the charged floating gate may be selected to obtain a specific threshold voltage under the gate arrangement without interrupting the two dimensional electron gas.

In a device according to the present invention, first III-nitride semiconductor body is comprised of one semiconductor alloy from the InAlGaN system, e.g., preferably, GaN, and the second III-nitride semiconductor body is comprised of another semiconductor alloy from the InAlGaN system, e.g., preferably, AlGaN.

According to an aspect of the present invention, the gate arrangement includes a gate insulation body, e.g., $Si_3N_4$ or $SiO_2$.

A semiconductor device according to the present invention may be formed as a discrete device over a substrate such as a silicon substrate, a silicon carbide substrate, or a sapphire substrate; or it may be formed as part of an integrated circuit alongside other elements in a common semiconductor body.

Other features and advantages of the present invention will become apparent from the following description of the invention which refers to the accompanying drawings.

DETAILED DESCRIPTION OF THE FIGURES

Figure 1:
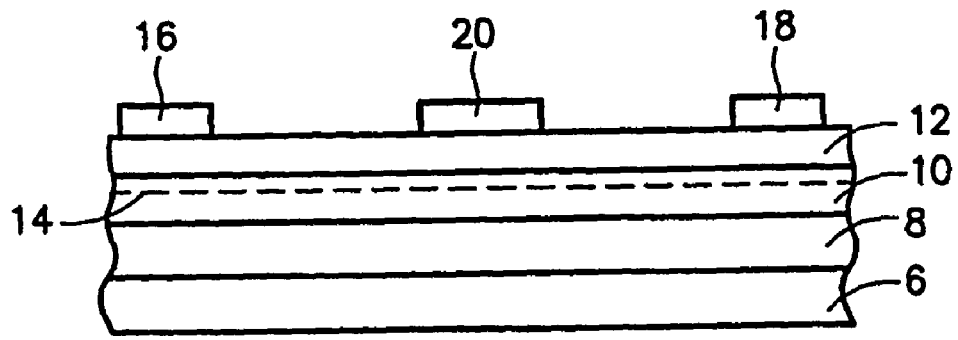
FIG. 1 schematically shows a cross-sectional view of the active region of a III-nitride power semiconductor device according to the prior art.

FIG. 1 illustrates an example of a typical III-nitride heterojunction high electron mobility transistor (HEMT). Specifically, a HEMT according to the prior art includes a first III-nitride semiconductor body 10 having one band gap, which may be composed of, for example, GaN, and a second III-nitride semiconductor body 12 having another band gap, which may be composed of, for example, AlGaN, disposed over first semiconductor body 10. First semiconductor body 10 may be formed over a transition body 8 composed, for example, of AlN, which is itself formed over substrate 6. As is known, transition body 8 could be a series of layers including GaN, AlGaN, AlN, InGaAlN in various orders, to relieve stress due to the mismatch of a hetero-epitaxial layer with a substrate.

As is well known, the heterojunction of first III-nitride semiconductor body 10 and second III-nitride semiconductor body 12 results in the formation of a conductive region usually referred to as a two dimensional electron gas or 2DEG 14. Current may be conducted between a first power electrode 16 (which is ohmically coupled to second semiconductor body 12), and second power electrode 18 (which is also ohmically coupled to second semiconductor body 12) through 2DEG 14.

A conventional HEMT, such as the one seen in FIG. 1, is a normally ON device. A gate structure 20 may be disposed between first power electrode 16 and second power electrode 18 in order to turn the device OFF. Gate structure 20 includes at least a gate electrode which may be electrically insulated by a gate insulation and thus capacitively coupled to second III-nitride semiconductor body 12. The application of an appropriate voltage to the gate electrode of gate structure 20 causes the interruption of 2DEG 14 thereby turning the device OFF.

Figure 2:
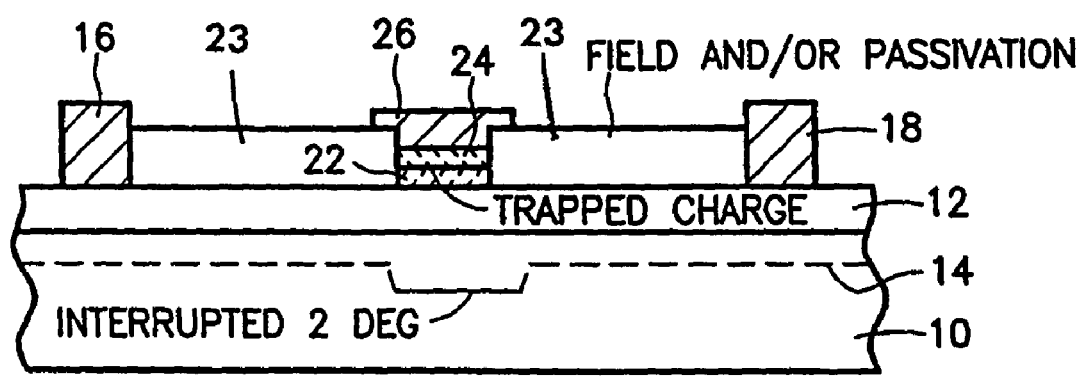
FIG. 2 schematically shows a cross-sectional view of the active region of a related III-nitride heterojunction power device.

Referring to FIG. 2, in which like numerals identify like features, a device according to copending U.S. patent application Ser. No. 11/460,725, assigned to the assignee of the present application, includes a gate structure having first insulation body 22 disposed over a portion of second III-nitride semiconductor body 12, second insulation body 24 disposed on first insulation body 22, and gate electrode 26. A field or passivation layer 23 is provided as shown. First insulation body 22 and second insulation body 24 are selected in order to create a charge trap. That is, charge can be trapped between first insulation body 22 and the second insulation body 24. The amount of trapped charge can be selected so that 2DEG 14 below gate electrode 26 is interrupted, thereby rendering the device normally OFF. An application of an appropriate voltage can then restore 2DEG 14 and render the device ON. Thus, a normally OFF switchable device can be obtained.

Figure 3:
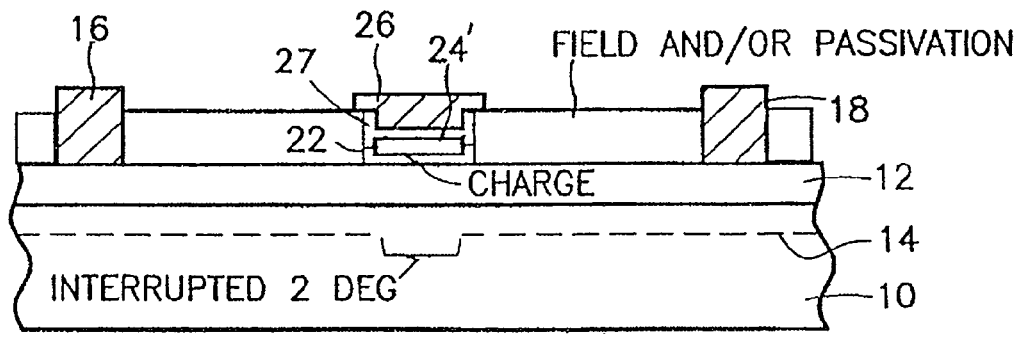
FIG. 3 schematically shows a cross-sectional view of the active region of a III-nitride heterojunction power device according to the first embodiment of the present invention.

Referring now to FIG. 3, in which like numerals identify like features, a device according to the first embodiment of the present invention includes a gate arrangement having a non-volatile charged floating gate 24' that resides on gate insulation 22' and below gate electrode 26. Note that charged floating gate 24' and gate electrode 26 are electrically insulated from one another by an insulation spacer 27. Preferably, gate insulation 22' is formed with $Si_3N_4$, but may also be formed with $SiO_2$ or any other suitable dielectric. Moreover, insulation spacer may be formed with any suitable dielectric such as $SiO_2$, $Si_3N_4$ or the like. Non-volatile as used herein means that the charge in the charged floating gate electrode remains resident without the need for a continuous application of an external voltage.

According to one aspect of the present invention, the charge in charged floating gate 24' may be selected to interrupt 2DEG 14 below the gate arrangement, whereby the device is rendered normally OFF. Further charging of charged floating electrode 24' allows for setting of the threshold voltage (voltage required for restoring 2DEG 14 to turn the device ON). Thus, the threshold voltage of the device can be programmed.

According to another aspect of the present invention, floating gate 24' can be charged only to vary the threshold voltage (in this case the voltage required to interrupt 2DEG 14 to turn the device OFF) without actually rendering 2DEG 14 OFF. Thus, the threshold voltage of the device can be programmed without rendering the device normally OFF.

Figure 4:
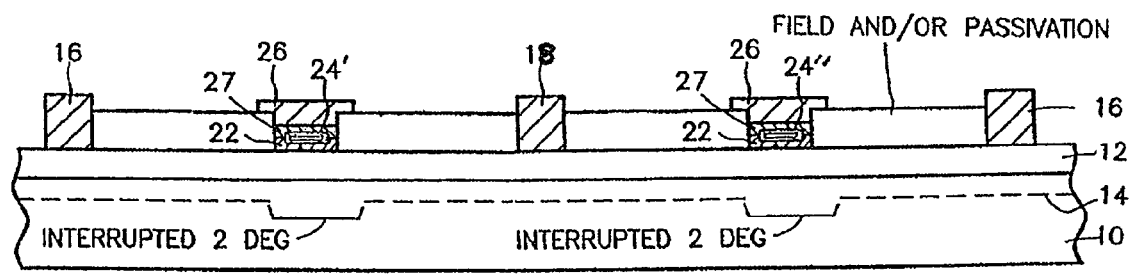
FIG. 4 schematically shows a cross-sectional view of a portion of the gate structure of a III-nitride heterojunction power device according to the second embodiment of the present invention.

Referring next to FIG. 4, in which like numerals identify like features, a device according to the second embodiment of the present invention includes two or more gate arrangements each including a respective non-volatile charged floating gate 24', 24" to interrupt 2DEG 14 thereunder according to the present invention, each having a charge value different from the charge value of the other. Thus, for example, charged floating gate 24' may be charged to obtain a threshold voltage of +2V to turn ON 2DEG 14 thereunder and charged floating gate 24" may be charged to obtain a threshold voltage of +4V to restore 2DEG 14 thereunder.

A device according to the second embodiment is not limited to floating gates with two different charge values, but may include more than two floating gates each having its own charge value.

Floating gates in a device according to the present invention may be formed of any suitable conductive material that can be charged such as a suitable metal or a suitable polysilicon body or the like. Once formed, a floating gate can be charged using any known method such as tunneling or hot electron injection. Optionally, a floating gate in a device according to the present invention may be rechargeable.

A device according to the present invention can be fabricated by disposing one III-nitride semiconductor body having one band gap over another III-nitride semiconductor body of another band gap to obtain a two dimensional electron gas, forming a gate insulation body over the second III-nitride semiconductor body, forming a floating gate electrode over the gate insulation body, and charging the floating gate electrode to obtain a non-volatile charged floating gate electrode. The process would also include forming power electrodes as well as forming gate electrode 26. In the preferred embodiment, insulation spacer 27 is formed over floating gate electrode 27, and gate electrode 26 is formed over spacer 27 prior to charging the floating gate electrode. Tunneling or hot electron injection may be used to charge the floating gate electrode as desired to obtain a device according to the present invention.

Substrate 6 is preferably formed from Si, but may be formed from SiC, Sapphire, or the like. Alternatively, substrate 6 may be formed from a bulk III-nitride semiconductor (e.g. bulk GaN) which is compatible with first semiconductor body 10, in which case transition body 8 may be eliminated.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device including a programmed threshold voltage, said semiconductor device comprising:
    a first III-nitride semiconductor body having a band gap;
    a second III-nitride semiconductor body having another band gap over said first III-nitride semiconductor body to form a two dimensional electron gas;
    first and second power electrodes coupled to said second III-nitride semiconductor body;
    a gate arrangement disposed over said second III-nitride semiconductor body, the gate arrangement including a non-volatile charged floating gate electrode, and a gate electrode arranged over said non-volatile charged floating gate electrode, said non-volatile charged floating gate electrode maintaining said programmed threshold voltage when a high current is present in said two dimensional electron gas of said power semiconductor device.

2. The semiconductor device of claim 1, wherein said first III-nitride semiconductor body is comprised of one semiconductor alloy from the InAlGaN system, and said second III-nitride semiconductor body is comprised of another semiconductor alloy from the InAlGaN system.

3. The semiconductor device of claim 1, wherein said first III-nitride semiconductor body is comprised of GaN, and said second III-nitride semiconductor body is comprised of AlGaN.

4. The semiconductor device of claim 1, further comprising a gate insulation body disposed between said charged floating gate electrode and said second III-nitride semiconductor body.

5. The semiconductor device of claim 4, wherein said one insulation body is comprised of silicon nitride.

6. The semiconductor device of claim 1, wherein said charged floating gate electrode is charged to interrupt said two dimensional electron gas.

7. The semiconductor device of claim 1, wherein the threshold voltage of said two dimensional electron gas beneath said gate arrangement is set by the charge in said charged floating gate electrode.

8. The semiconductor device of claim 1, further comprising a silicon substrate.

9. The semiconductor device of claim 1, further comprising a silicon carbide substrate.

10. The semiconductor device of claim 9, further comprising a sapphire substrate.

11. The semiconductor device of claim 1, wherein said semiconductor device is a discrete power device.

12. The semiconductor device of claim 1, wherein said semiconductor device is an integrated circuit.

13. The semiconductor device of claim 1, wherein said charged floating gate electrode is negatively charged.

14. The semiconductor device of claim 1, further comprising another gate arrangement said another gate arrangement including a charged floating gate electrode that is charged differently than said charged floating gate electrode of said gate arrangement and a gate electrode that is shorted to said gate electrode of said gate arrangement.

15. The semiconductor device of claim 1, wherein said charged floating gate electrode is rechargeable.

16. A method of fabricating a semiconductor device including a programmed threshold voltage, comprising:

disposing one III-nitride semiconductor body having one band gap over another III-nitride semiconductor body of another band gap to obtain a two dimensional electron gas;

forming a gate insulation body over said second III-nitride semiconductor body;

forming a floating gate electrode over said gate insulation body;

disposing a gate electrode over said floating gate electrode; and charging said floating gate electrode to obtain a non-volatile charged floating gate electrode;

maintaining said programmed threshold voltage when a high current is present in said two dimensional electron gas of said semiconductor device.

17. The method of claim 16, wherein said floating gate electrode is charged to interrupt said two dimensional electron gas.

18. The method of claim 16, wherein said floating gate electrode is charged to vary the threshold voltage beneath said gate arrangement.

19. The method of claim 16, wherein said floating gate is charged using a tunneling method.

20. The method of claim 17, wherein said floating gate electrode is charged using hot electron injection.

* * * * *